United States Patent
Ikeda

(10) Patent No.: US 10,032,925 B2
(45) Date of Patent: Jul. 24, 2018

(54) IMAGING ELEMENT, ELECTRONIC APPLIANCE, METHOD FOR DRIVING IMAGING DEVICE, AND METHOD FOR DRIVING ELECTRONIC APPLIANCE

(71) Applicant: SEMICONDUCTOR ENERGY LABORATORY CO., LTD., Atsugi-shi, Kanagawa-ken (JP)

(72) Inventor: Takayuki Ikeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 2 days.

(21) Appl. No.: 14/721,023

(22) Filed: May 26, 2015

(65) Prior Publication Data

US 2015/0349129 A1    Dec. 3, 2015

(30) Foreign Application Priority Data

May 29, 2014    (JP) .................................. 2014-111133

(51) Int. Cl.
   *H01L 29/786*    (2006.01)
   *H01L 27/148*    (2006.01)
   *H01L 27/146*    (2006.01)

(52) U.S. Cl.
   CPC ........ *H01L 29/7869* (2013.01); *H01L 27/146* (2013.01); *H01L 27/148* (2013.01);
   (Continued)

(58) Field of Classification Search
   CPC .... H01L 29/786; H01L 27/146; H01L 27/148
   See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Joseph C Nicely
*Assistant Examiner* — Lamont Koo
(74) *Attorney, Agent, or Firm* — Nixon Peabody LLP; Jeffrey L. Costellia

(57) ABSTRACT

An imaging element which is capable of obtaining a piece of image data by performing light exposure plural times is provided. In addition, an imaging element which is capable of obtaining image data with little noise is provided. Furthermore, an imaging device with reduced power consumption is provided. In an imaging element including a pixel, the pixel includes a photodiode, a transistor including an oxide semiconductor layer, a diode, and a charge retention portion. The polarity of an electrode of the photodiode which is connected to the transistor is the same as that of an electrode of the diode which is connected to the transistor.

8 Claims, 15 Drawing Sheets

(52) U.S. Cl.
CPC .. *H01L 27/14632* (2013.01); *H01L 27/14643* (2013.01); *H01L 29/786* (2013.01); *H01L 27/14621* (2013.01)

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0110093 A1* | 5/2005 | Altice, Jr. | H01L 27/14609 257/359 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0256940 A1* | 10/2009 | Pahr | H04N 5/3698 348/308 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0187401 A1* | 7/2010 | Kawahito | H01L 27/14609 250/208.1 |
| 2011/0108706 A1 | 5/2011 | Koyama | |
| 2011/0108836 A1 | 5/2011 | Koyama et al. | |
| 2011/0215323 A1 | 9/2011 | Kurokawa et al. | |
| 2012/0085892 A1* | 4/2012 | Hirose | G01J 1/44 250/214.1 |
| 2015/0263053 A1 | 9/2015 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-119950 A | 6/2011 |
| JP | 2013-232918 A | 11/2013 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YBFE2O4, and YB2FE3O7 Types of Structures for Compounds in the In2O3 and Sc2O3—A2O3-BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06: Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17 22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "Suftla Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tamdem OLEDs", SID Digest '09 : SID International Symposium Digest of Technical Papers, May 31, 2009, vol. 40, pp. 899-902.
Jin.D et al., "65.2:Distinguished Paper:World-Largest (6.5Δ) Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al.,"15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

(56) References Cited

OTHER PUBLICATIONS

Orita.M et al., "Mechanism of Electrical Conductivity of Transparent InGaZnO4", Phys. Rev B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", JPN. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B. (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Syposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

IMAGING ELEMENT, ELECTRONIC APPLIANCE, METHOD FOR DRIVING IMAGING DEVICE, AND METHOD FOR DRIVING ELECTRONIC APPLIANCE

BACKGROUND OF THE INVENTION

1. Field of the Invention

One embodiment of the present invention relates to an imaging element, an electronic appliance, a method for driving an imaging element, and a method for driving an electronic appliance.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Another embodiment of the present invention relates to a semiconductor device, a display device, a lighting device, a power storage device, a memory device, or a driving method or manufacturing method thereof.

2. Description of the Related Art

Charge-coupled device (CCD) imaging elements and complementary metal oxide semiconductor (CMOS) imaging elements are known as imaging elements that are mounted on mobile phones, smartphones, digital cameras, digital single-lens reflex cameras, and digital video cameras. In particular, CMOS imaging elements are more advantageous than CCD imaging elements because of their low power consumptions and high resolutions, and therefore, have been developed actively.

A rolling shutter system and a global shutter system are known as driving systems of CMOS imaging elements. In a rolling shutter system, pixels are sequentially exposed to light row by row. In a global shutter system, all the pixels are exposed to light at a time. The time of light exposure differs between pixels in a rolling shutter system; therefore, there is a problem in that a captured image is distorted in the case where the object is moving. Meanwhile, in a global shutter system, since all the pixels are exposed to light at the same time, a captured image does not have distortion even when the object is moving. Thus, a global shutter system is superior to a rolling shutter system as a method for driving a CMOS imaging element. However, in a global shutter system, the time of reading stored charge differs between pixels. Therefore, when leakage current is generated in a transfer transistor, charge which is generated in a photodiode cannot be retained, which causes a problem in that inherent information of the object is not reflected in an image. Against the problem, techniques for reducing leakage of charge with the use of a transistor including an oxide semiconductor as a transfer transistor are disclosed (Patent Documents 1 and 2).

In digital cameras and the like including CMOS imaging elements, digital image processing enables shooting modes such as long exposure and multiple exposure. In a silver salt film (analog) camera, long exposure corresponds to a shooting mode in which light exposure is performed while a shutter remains open for a long time. Long exposure is frequently used in taking an image of celestial objects because it makes it possible to take an image of the trajectory of a moving object. Multiple exposure corresponds to a shooting mode in which one image is obtained by superimposition of a plurality of images. The multiple exposure can provide an image which cannot be obtained by a normal shooting mode, which leads to creation of an image good in design. It is difficult to take an image while a shutter remains open for several hours in digital camera and the like. An image taken with a digital camera or the like is stored as image data and easily processed. Therefore, in shooting modes such as long exposure and multiple exposure, a process in which pieces of image data are prepared and synthesized to obtain one image data is generally executed.

REFERENCE

Patent Document

[Patent Document 1] Japanese Published Patent Application No. 2011-119950
[Patent Document 2] Japanese Published Patent Application No. 2013-232918

SUMMARY OF THE INVENTION

However, it is necessary to store pieces of image data in long exposure and multiple exposure with synthesis of image data, and a large-capacity storage medium is needed to store the pieces of image data. In addition, it is necessary to convert analog data into digital data when the pieces of image data are stored, and therefore continuous driving of a processing circuit such as an A/D conversion circuit is needed. These cause a problem of high power consumption of a digital camera or the like. Furthermore, since the processing circuit such as an A/D conversion circuit is driven continuously, dark current noise is likely to be generated in an imaging element. Therefore, noisy image data is often obtained. In the case where pieces of such noisy image data are synthesized, the resulting image data has amplified noise.

Thus, in one embodiment of the present invention, an imaging element which is capable of obtaining a piece of image data by performing light exposure plural times is provided. In addition, an imaging element which is capable of obtaining image data with little noise is provided. Furthermore, an imaging device with reduced power consumption is provided. In addition, a novel imaging device is provided.

One embodiment of the present invention does not necessarily achieve all the objects listed above and only needs to achieve at least one of the objects. The description of the above objects does not disturb the existence of other objects. Other objects are apparent from and can be derived from the description of the specification, the drawings, the claims, and the like.

One embodiment of the present invention is an imaging element including a pixel. The pixel includes a photodiode, a transistor including an oxide semiconductor layer, a diode, and a charge retention portion. One of a source and a drain of the transistor is electrically connected to a first electrode of the photodiode, the other of the source and the drain of the transistor is electrically connected to a first electrode of the diode, a second electrode of the diode is electrically connected to the charge retention portion, and the polarity of the first electrode of the photodiode is the same as that of the first electrode of the diode.

One embodiment of the present invention is an imaging element including a pixel. The pixel includes a photodiode, a first transistor, a second transistor, a third transistor, a fourth transistor, a fifth transistor, and a sixth transistor. One of a source and a drain of the first transistor is electrically connected to a first electrode of the photodiode, the other of the source and the drain of the first transistor is electrically connected to one of a source and a drain of the second transistor, the other of the source and the drain of the second transistor is electrically connected to a gate of the third transistor, one of a source and a drain of the third transistor is electrically connected to one of a source and a drain of the fourth transistor, one of a source and a drain of the fifth transistor is electrically connected to the first electrode of the photodiode and the one of the source and the drain of the first transistor, and one of a source and a drain of the sixth transistor is electrically connected to the other of the source and the drain of the second transistor. A gate of the fourth transistor is connected so as to be supplied with a first signal, a gate of the fifth transistor is connected so as to be supplied with a second signal, and a gate of the sixth transistor is connected so as to be supplied with to a third signal. The first transistor includes an oxide semiconductor. A gate of the second transistor is electrically connected to the source or the drain of the second transistor.

One embodiment of the present invention is a method for driving an imaging element including a pixel. The pixel includes a photodiode, a transistor which includes an oxide semiconductor layer and a gate connected to a first signal line, and a charge retention portion to which charge generated in the photodiode is transferred through the transistor. After a potential at which the transistor is turned on is supplied to the first signal line plural times, a signal corresponding to a potential of the charge retention portion is output from the pixel.

According to one embodiment of the present invention, an imaging element which obtains one piece of image data without storing a plurality of pieces of image data even in a shooting mode such as long exposure or multiple exposure can be provided. Since power supply to an A/D conversion circuit or the like can be stopped when light exposure is performed plural times, dark current noise is less likely to be generated. Therefore, an imaging element capable of image data with little noise, and an imaging device with reduced power consumption can be provided. A novel imaging device can be provided.

Note that the description of these effects does not disturb the existence of other effects. One embodiment of the present invention does not necessarily have all the effects listed above. Other effects will be apparent from and can be derived from the description of the specification, the drawings, the claims, and the like.

DETAILED DESCRIPTION OF THE INVENTION

Figure 1:
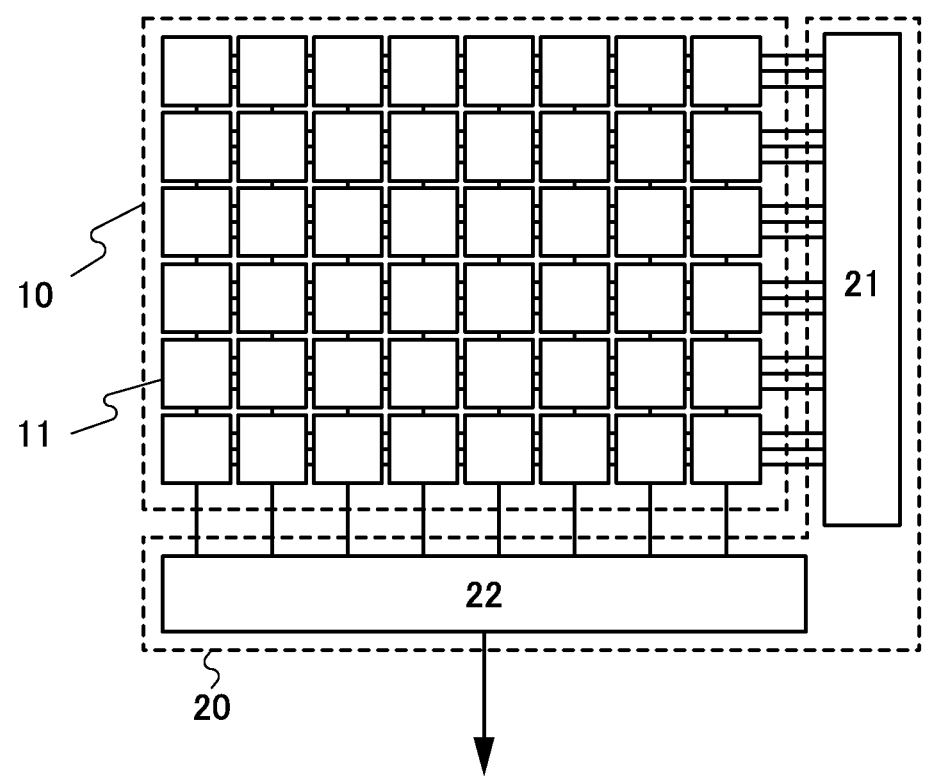
FIG. 1 illustrates an example of a configuration of an imaging element.

Embodiments and examples of the present invention will be described in detail with reference to the accompanying drawings. Note that the present invention is not limited to the description below, and it is easily understood by those skilled in the art that various changes and modifications can be made without departing from the spirit and scope of the present invention. Therefore, embodiments of the present invention should not be construed as being limited to the description of the embodiments below. In addition, each of the embodiments described below can be implemented by being combined with any of the other embodiments given in this specification. Note that in the embodiments of the present invention to be described below, the same reference numerals are used to denote the same components in different drawings.

Note that in this specification and the like, part of a diagram or a text described in one embodiment can be taken out to constitute one embodiment of the invention. Thus, in the case where a diagram or a text related to a certain portion is described, the context taken out from part of the diagram or the text is also disclosed as one embodiment of the invention, and one embodiment of the invention can be constituted. The embodiment of the present invention is clear. Therefore, for example, in a diagram or text in which one or more active elements (e.g., transistors), wirings, passive elements (e.g., capacitors), conductive layers, insulating layers, semiconductor layers, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (or may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

In addition, contents that are not specified in any text or drawing in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constructed. In this manner, it is possible to specify the technical scope of one embodiment of the present invention so that a conventional technology is excluded, for example.

In this specification and the like, it might be possible for those skilled in the art to constitute one embodiment of the invention even when portions to which all the terminals of an active element (e.g., a transistor), a passive element (e.g., a capacitor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Thus, it might be possible to constitute one embodiment of the invention by specifying only portions to which some of terminals of an active element (e.g., a transistor), a passive element (e.g., a capacitor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

(Embodiment 1)

FIG. 1 illustrates a configuration diagram of an imaging element of one embodiment of the present invention. The imaging element includes a pixel portion 10 including a plurality of pixels 11, and a control circuit 20 which is electrically connected to each of the pixels 11. The control circuit 20 includes a driver circuit 21 which supplies an input signal for controlling each of the pixels 11, and a signal processing circuit 22 to which an output signal is output from each of the pixels 11. Note that the signal processing circuit 22 may include an amplifier circuit. An output signal from the signal processing circuit 22 is, for example, input to a circuit including an A/D conversion circuit and is converted into image data. Although the driver circuit 21 and the signal processing circuit 22 are separately provided in FIG. 1, they may be integrated.

For example, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, that is, the case where X and Y are connected without the element that allows the electrical connection between X and Y provided therebetween.

For example, in the case where X and Y are electrically connected, one or more elements that allows an electrical connection between X and Y can be connected between X and Y. A switch is controlled to be on or off. That is, a switch is conducting or not conducting (is turned on or off) to determine whether a current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a boosting circuit or a voltage lower control circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is provided between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another element or another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to a part of Z1 and another part of Z1 is directly connected to X while a drain (or a second terminal or the like) of the transistor is directly connected to a part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Other examples of the expressions also include "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path", and "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are only examples and one embodiment of the present invention is not limited to the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

A prism may be provided in the pixel portion 10 so as to divide light which is incident on the pixel portion 10 into red light, green light, and blue light. Imaging of any of the red light, the green light, and the blue light is performed by each of the pixels 11, whereby full-color image data can be obtained. Furthermore, the full-color image data can also be obtained in such a manner that a red color filter, a green color filter, and a blue color filter are provided in the pixels 11, and the pixels 11 perform imaging of light which is incident on the pixels 11 through the color filters. Note that although the pixels 11 are arranged in a matrix in FIG. 1, the arrangement of the pixels 11 is not limited thereto.

Figure 2:
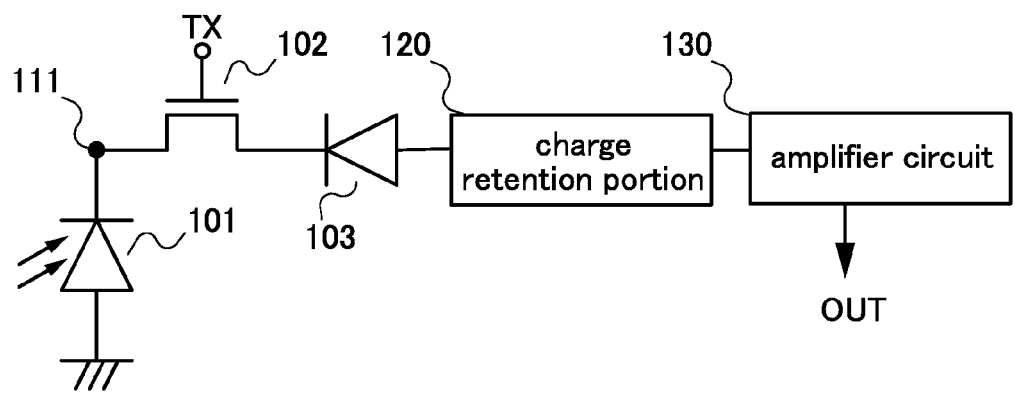
FIG. 2 is a circuit diagram illustrating an example of a configuration of an imaging element.

FIG. 2 is a circuit diagram of the pixel 11. The pixel 11 includes a photodiode 101, a transfer transistor 102, a diode 103, a charge retention portion 120, and an amplifier circuit 130. One of a source and a drain of the transfer transistor 102 is electrically connected to a cathode of the photodiode 101, and the other of the source and the drain of the transfer transistor 102 is electrically connected to a cathode of the diode 103. Although the cathode of the photodiode 101 and the cathode of the diode 103 are connected to each other through the transfer transistor 102 in FIG. 2, an anode of the photodiode 101 and an anode of the diode 103 may be connected to each other through the transfer transistor 102. That is, it is necessary that an electrode of the photodiode 101 and an electrode of the diode 103 which are connected to the transfer transistor 102 have the same polarity. A gate of the transfer transistor 102 is connected to a transfer signal line (TX). The anode of the diode 103 is electrically connected to the charge retention portion 120. The charge retention portion 120 is electrically connected to the amplifier circuit 130. Note that in this embodiment, all the transistors are n-channel transistors.

Note that a source of a transistor in this specification and the like means a source region that is part of a semiconductor functioning as an active layer or a source electrode connected to the semiconductor film. Similarly, a drain of a transistor means a drain region that is part of the semiconductor or a drain electrode that is connected to the semiconductor. A gate means a gate electrode.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

When light is incident on the photodiode 101, the photodiode 101 generates charge. The amount of the charge depends on the intensity of the incident light. When a low level potential is supplied to the transfer signal line (TX), the transfer transistor 102 is turned off. Since the transfer transistor 102 is turned off, the charge generated by the photodiode 101 is accumulated in a node 111. When a high level potential is supplied to the transfer signal line (TX), the transfer transistor 102 is turned on. When the transfer transistor 102 is turned on, the charge in the node 111 is transferred to the charge retention portion 120 through the diode 103. That is, the potential of the charge retention portion 120 becomes equal to the potential of the node 111. Note that in the case where the potential of the node 111 is higher than the potential of the charge retention portion 120, a reverse bias is applied to the diode 103; therefore, even when a high level potential is supplied to the transfer signal line (TX) to turn on the transfer transistor 102, current does not flow. In this case, the potential of the charge retention portion 120 does not change. That is, the charge retention portion 120 retains the same potential. In this manner, since the diode 103 is provided, when the potential of the node 111 is lower than a reference, i.e., the potential of the charge retention portion 120, the potential of the node 111 is written in the charge retention portion 120; whereas when the potential of the node 111 is higher than the reference, the potential of the charge retention portion 120 is retained as it is. The amplifier circuit 130 amplifies the potential of the charge retention portion 120 and outputs a signal having the amplified potential. Note that it is preferable that the transfer transistor 102 be a transistor including an oxide semiconductor layer. A transistor including an oxide semiconductor layer has a lower off-state current than a transistor including a silicon semiconductor layer. Therefore, the use of a transistor including an oxide semiconductor layer as the transfer transistor 102 can prevent leakage of charge retained in the charge retention portion 120. In other words, the use of a transistor including an oxide semiconductor layer as the transfer transistor 102 makes it possible to inhibit a reduction in the potential of the charge retention portion 120 for a long time.

Figure 3A:
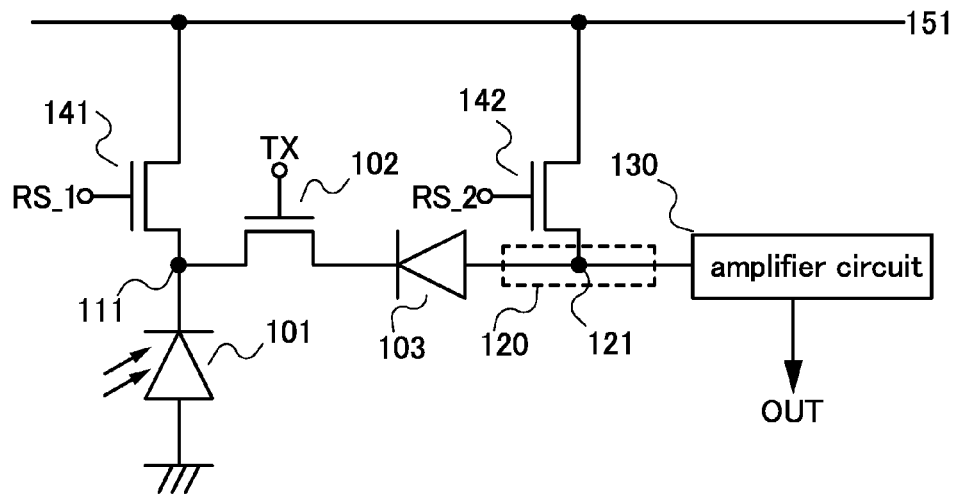
FIGS. 3A and 3B are circuit diagrams each illustrating an example of a configuration of an imaging element.

In order that change accumulated in the pixel 11 can be reset, the pixel 11 preferably includes a reset transistor. FIG. 3A is a diagram of a circuit including two reset transistors. One of a source and a drain of a reset transistor 141 is electrically connected to a wiring 151, and the other of the source and the drain of the reset transistor 141 is electrically connected to the node 111. One of a source and a drain of a reset transistor 142 is electrically connected to the wiring 151, and the other of the source and the drain of the reset transistor 142 is electrically connected to a node 121. A gate of the reset transistor 141 is connected to a first reset signal line (RS_1), and a gate of the reset transistor 142 is connected to a second reset signal line (RS_2). Note that in the circuit diagram in FIG. 3A, a high level potential is supplied to the wiring 151. In contrast, when the polarities of the photodiode 101 and the diode 103 are inversed, a low level potential is supplied to the wiring 151.

When a high level potential is supplied to the first reset signal line (RS_1) to turn on the reset transistor 141, it is possible to release charge generated by the photodiode 101. That is, the potential of the node 111 becomes a high level potential, so that the potential of the node 111 is reset. When a high level potential is supplied to the second reset signal line (RS_2) to turn on the reset transistor 142, it is possible to release charge retained in the charge retention portion 120. That is, the potential of the node 121 becomes a high level potential, so that the potential of the node 121 is reset. In order to separately reset the potential of the node 111 and the potential of the node 121, the reset transistors connected to the respective nodes are preferably connected to different signal lines, like the first reset signal line (RS_1) and the second reset signal line (RS_2). Note that it is preferable that the reset transistor 141 and the reset transistor 142 be each a transistor including an oxide semiconductor layer. A transistor including an oxide semiconductor layer has a lower off-state current than a transistor including a silicon semiconductor layer. Therefore, the use of a transistor including an oxide semiconductor layer as each of the reset transistor 141 and the reset transistor 142 can prevent leakage of charge retained in the node 111 and the node 121. In other words, the use of a transistor including an oxide semiconductor layer as each of the reset transistor 141 and the reset transistor 142 makes it possible to inhibit a reduction in the potentials of the node 111 and the node 121 for a long time.

Figure 3B:
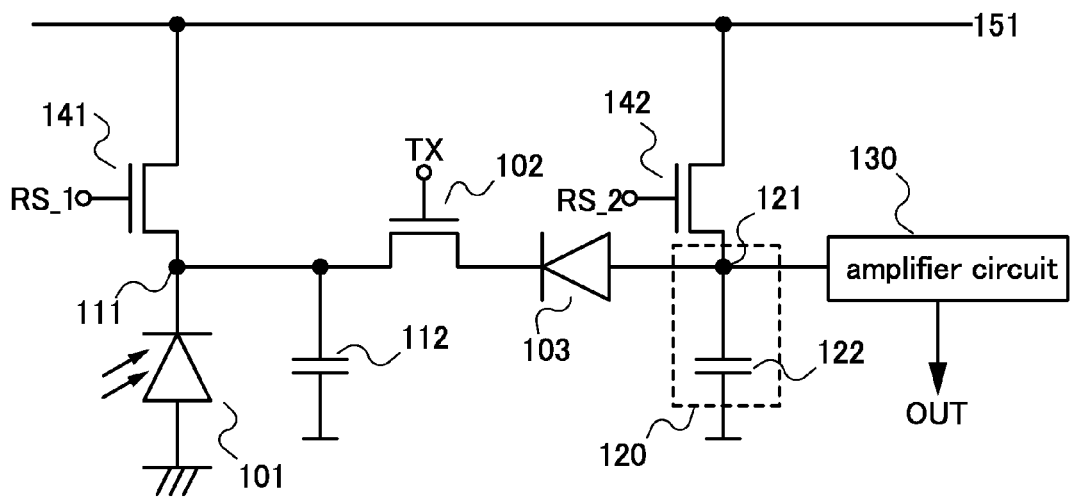

In the case where light with high intensity is incident on the photodiode 101, it is necessary that the charge generated by the photodiode 101 is sufficiently accumulated in the pixel 11. To achieve this, the pixel 11 may include a capacitor. FIG. 3B is a diagram of a circuit including a capacitor. The circuit diagram of FIG. 3B is the same as the circuit diagram of FIG. 3A except for a capacitor 112 and a capacitor 122. One electrode of the capacitor 112 is electrically connected to the node 111. One electrode of the capacitor 122 is electrically connected to the node 121. Although the two capacitors, the capacitor 112 and the capacitor 122, are provided in the circuit in FIG. 3B, only any one of them may be provided. Capacitors can be provided as appropriate in consideration of the balance of charge accumulated in the pixel.

Figure 4:
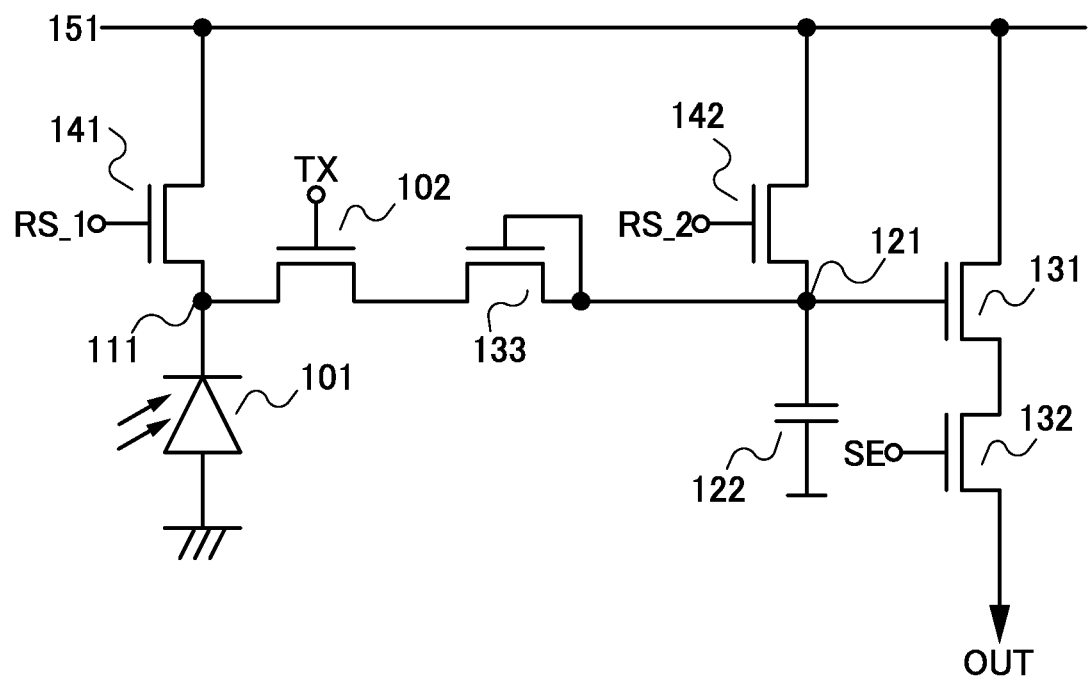
FIG. 4 is a circuit diagram illustrating an example of a configuration of an imaging element.

FIG. 4 is a diagram of a circuit in which transistors are used for the amplifier circuit and the diode. One of a source and a drain of a transistor 131 is electrically connected to the wiring 151, and the other of the source and the drain of the transistor 131 is electrically connected to one of a source and a drain of a transistor 132. A gate of the transistor 131 is electrically connected to the node 121. A gate of the transistor 132 is connected to a selection signal line (SE). One of a source and a drain of a transistor 133 is electrically connected to the node 111 through the transfer transistor 102. The other of the source and the drain of the transistor 133 is electrically connected to a gate of the transistor 133 and the node 121. Note that in the case where the polarity of the photodiode 101 is inversed, the gate of the transistor 133 is connected to the one of the source and the drain of the transistor 133. When a high level potential is supplied to the selection signal line (SE), a current corresponds to the potential of the node 121 flows in the transistor 131, and an output signal is output from the other of the source and the drain of the transistor 132. The output signal is converted into image data by an A/D converter circuit or the like. Note that the transistor 131, the transistor 132, and the transistor 133 may each be a transistor including an oxide semiconductor layer. The use of a transistor including an oxide semiconductor layer as an amplifier circuit, a diode, and the like leads to low power consumption of the imaging element or a high resolution.

Next, operations of the circuit in FIG. 4 are described with reference to timing charts in FIG. 5 and FIG. 6.

An initialization operation is described. At Time 201, a high level potential is supplied to the reset signal line (RS_1), whereby the reset transistor 141 is turned on, and the potential of the node 111 becomes equal to the potential of the wiring 151. That is, the potential of the node 111 is reset to a high level potential. In a similar manner, at Time 201, a high level potential is supplied to the reset signal line (RS_2), whereby the reset transistor 142 is turned on, and the potential of the node 121 becomes equal to the potential of the wiring 151. That is, the potential of the node 121 is reset to a high level potential.

A first light exposure operation is described. At Time 201, a high level potential is supplied to the transfer signal line (TX) to turn on the transfer transistor 102. At Time 202, a low level potential is supplied to the reset signal line (RS_1) and the reset signal line (RS_2) to terminate the initialization operation and start a light exposure operation. In a period from Time 202 to Time 203, charge is generated depending on the amount of the light incident on the photodiode 101 and the potentials of the nodes 111 and 121 decrease. At Time 203, a low level potential is supplied to the transfer signal line (TX) to turn off the transfer transistor 102. Thus, transfer of charge from the node 111 to the node 121 is stopped to terminate the first light exposure operation. Note that in a period from Time 203 to Time 204, the potential of the node 111 keeps decreasing owing to the charge generated by the photodiode 101. In contrast, the node 121 retains the potential which the node 121 has at Time 203 because the transfer transistor 102 is off.

Next, a second light exposure operation is described. At Time 204, a high level potential is supplied to the reset signal line (RS_1) and the transfer signal line (TX), whereby the node 111 is reset to a high level potential. At Time 205, a low level potential is supplied to the reset signal line (RS_1) to terminate the reset operation of the node 111 and start a light exposure operation. In a period from Time 205 to Time 206, when the potential of the node 111 becomes lower than the potential retained by the node 121 (FIG. 5), charge of the node 111 is transferred to the node 121. That is, the potential of the node 121 becomes equal to the potential of the node 111. In contrast, when the potential of the node 111 is not lower than the potential retained by the node 121 (FIG. 6), the charge of the node 111 is not transferred to the node 121. At Time 206, when the transfer signal line (TX) is set to a low level potential, the transfer of the charge from the node 111 to the node 121 is stopped to terminate the second light exposure operation. In a period from Time 206 to Time 207, the node 121 retains the potential which the node 121 has at Time 206.

The number of the second light exposure operations is not limited to one, and the second light exposure operation may be performed repeatedly. In this case, the node 121 retains the lowest potential of potentials obtained in the first light exposure operation and the repeated second light exposure operations. That is, the node 121 can retain a potential at the time when the amount of light incident on the photodiode 101 is largest.

An output operation is described. At Time 207, when a high level potential is supplied to the selection signal line (SE), a voltage signal corresponding to the potential retained in the node 121 is output from OUT. At Time 208, when a low level potential is supplied to the selection signal line (SE), the output of the voltage signal from OUT is stopped. Note that the voltage signal is converted into image data by the A/D conversion circuit or the like.

Figure 5:
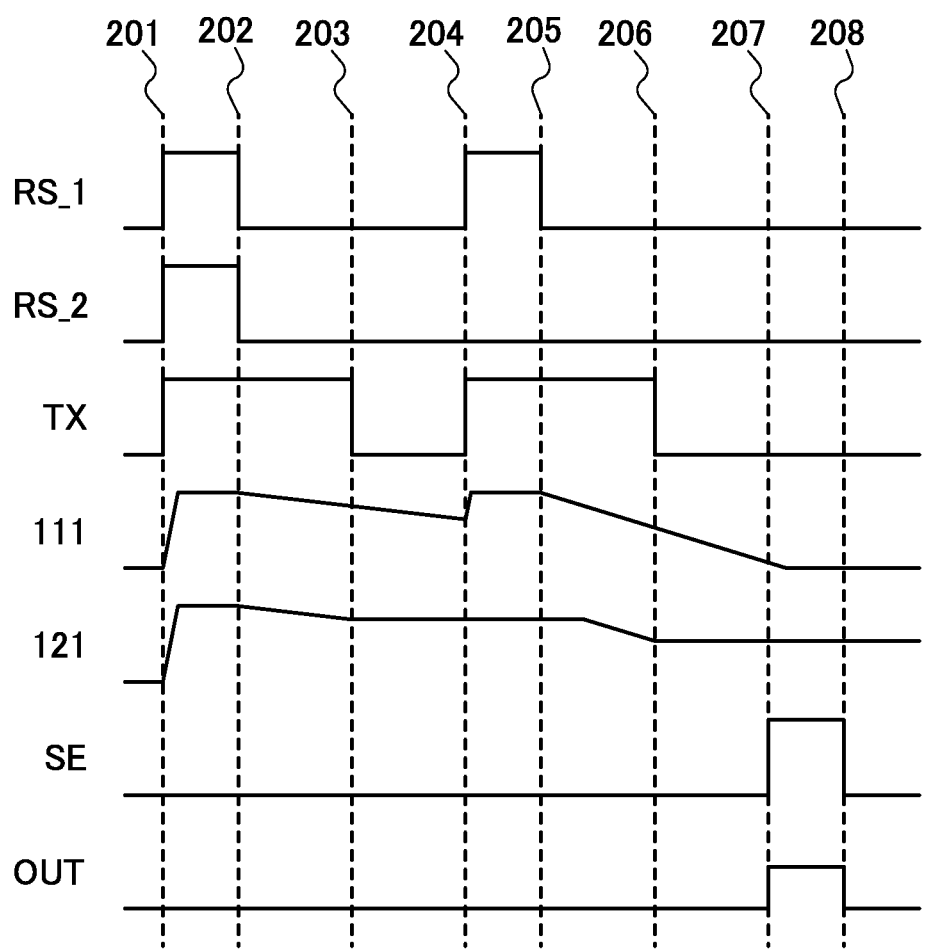
FIG. 5 is a timing chart showing an example of circuit operations of an imaging element.
Figure 6:
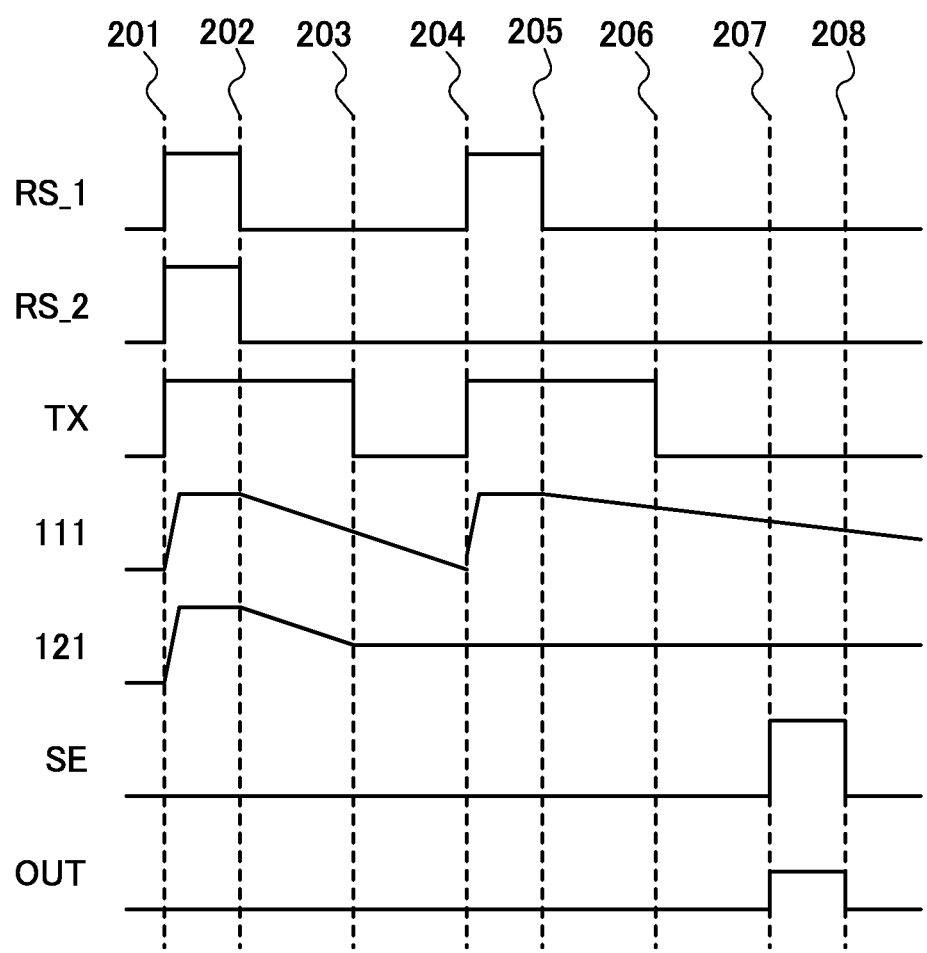
FIG. 6 is a timing chart showing an example of circuit operations of an imaging element.
Figure 7:
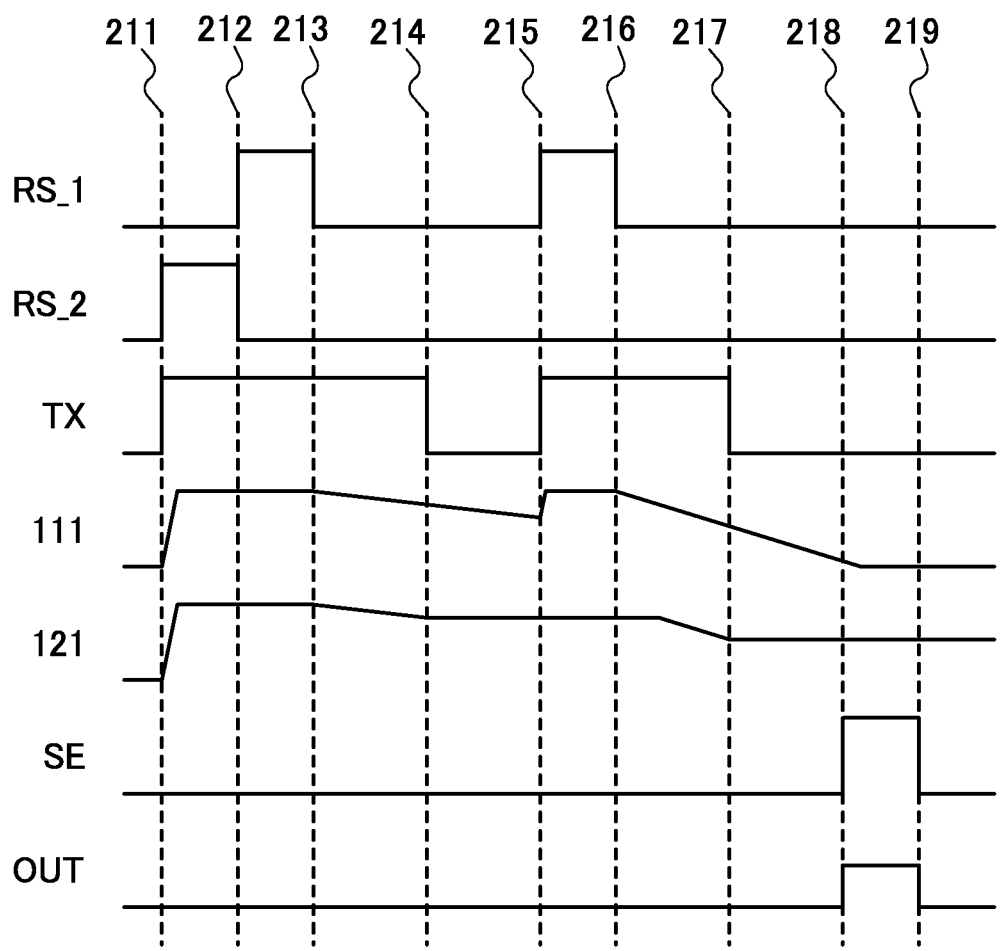
FIG. 7 is a timing chart showing an example of circuit operations of an imaging element.

The operations of the circuit in FIG. 4 are not limited to those in the timing charts in FIG. 5 and FIG. 6. Another example of the operations of the circuit in FIG. 4 is described using a timing chart in FIG. 7.

An initialization operation is described. At Time 211, a high level potential is supplied to the reset signal line (RS_2), whereby the potential of the node 121 becomes equal to the potential of the wiring 151, so that the node 121 can be reset.

A light exposure operation is described. At Time 212, a low level potential is supplied to the reset signal line (RS_2) to turn off the reset transistor 142. Furthermore, a high level potential is supplied to the reset signal line (RS_1) to turn on the reset transistor 141. At this time, although a high level potential is supplied to the transfer signal line (TX) to turn on the transfer transistor 102, the potential of the node 111 does not decrease because the reset transistor 141 is also on. Meanwhile, the node 121 retains the high level potential. Then, at Time 213, a low level potential is supplied to the reset signal line (RS_1) to start the light exposure operation. Charge corresponding to the amount of light received by the photodiode 101 is generated, and the potentials of the nodes 111 and 121 decrease. At Time 214, when a low level potential is supplied to the transfer signal line (TX), the transfer of charge from the node 111 to the node 121 is stopped to terminate the light exposure operation. In a period from Time 214 to Time 215, although the potential of the node 111 keeps decreasing owing to the charge generated in the photodiode 101, the node 121 retains the potential which the node 121 has at Time 214.

In a period from Time 215 to Time 218, the light exposure operation from Time 212 to Time 215 is repeated. The number of the light exposure operations is not limited to one, and the light exposure operation may be performed repeatedly. In the case where the light exposure operation is repeated, the node 121 retains the lowest potential of potentials obtained by the repeated light exposure operations. That is, the node 121 retains a potential at the time when the amount of incident light is the largest.

An output operation is described. At Time 218, when a high level potential is supplied to the selection signal line (SE), a voltage corresponding to the potential retained in the node 121 is output from OUT. At Time 219, when a low level potential is supplied to the selection signal line (SE), the output from OUT is stopped.

In this operation, the light exposure operation includes reset of the node 111. Even when the light exposure operation is performed plural times, the first light exposure operation and the second to last light exposure operations are performed in the same manner. This leads to an advantage that the configuration of the driver circuit can be simplified.

Figure 8:
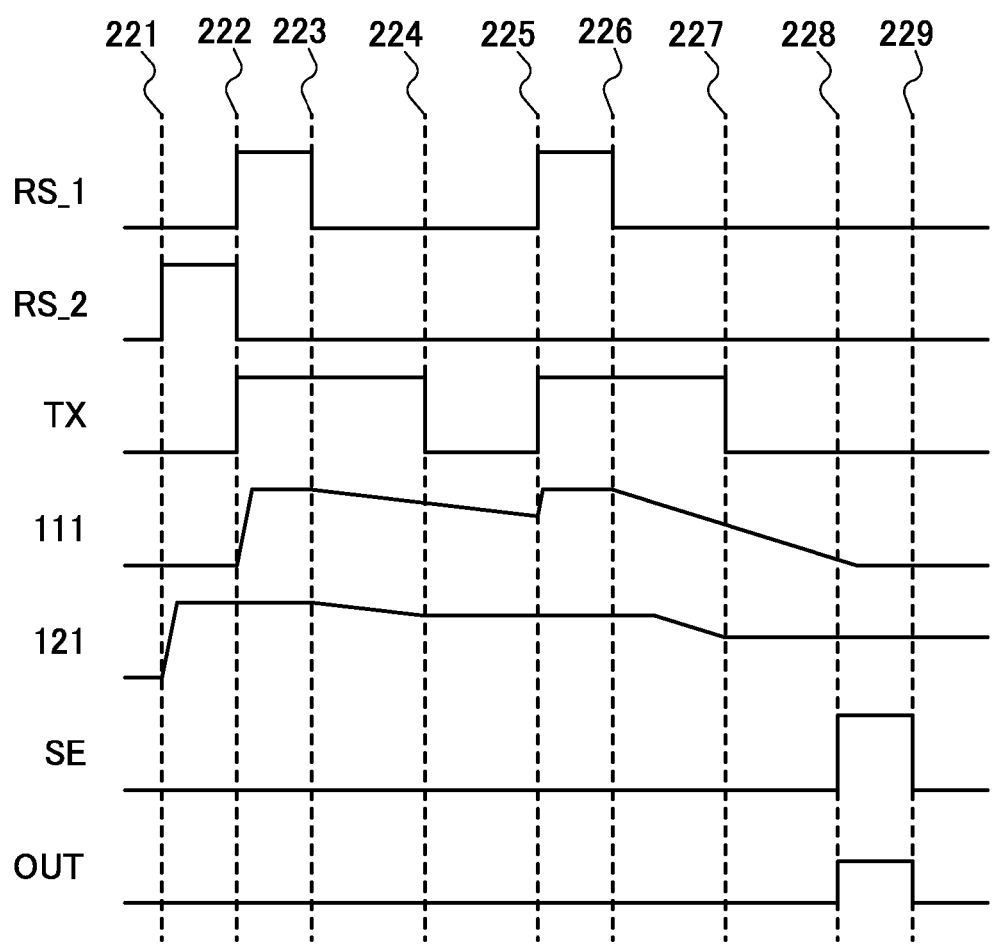
FIG. 8 is a timing chart showing an example of circuit operations of an imaging element.

Another example of the operations of the circuit in FIG. 4 is described using a timing chart in FIG. 8.

An initialization operation is described. At Time 221, a high level potential is supplied to the reset signal line (RS_2), whereby the potential of the node 121 becomes equal to the potential of the wiring 151, so that the node 121 can be reset.

A light exposure operation is described. At Time 222, a low level potential is supplied to the reset signal line (RS_2) to turn off the reset transistor 142. Then, a high level potential is supplied to the reset signal line (RS_1) to turn on the reset transistor 141; and a high level potential is supplied to the transfer signal line (TX). Although the transfer transistor 102 is on, the potential of the node 111 does not decrease because the reset transistor 141 is also on. Therefore, the node 121 retains the high level potential. Next, at Time 223, a low level potential is supplied to the reset signal line (RS_1) to start the light exposure operation. Charge corresponding to the amount of light received by the photodiode 101 is generated, and the potentials of the nodes 111 and 121 decrease. At Time 224, when a low level potential is supplied to the transfer signal line (TX), the transfer of charge from the node 111 to the node 121 is stopped to terminate the light exposure operation. In a period from Time 224 to Time 225, although the potential of the node 111 keeps decreasing owing to the charge generated in the photodiode 101, the node 121 retains the potential which the node 121 has at Time 224.

In a period from Time 225 to Time 228, the light exposure operation from Time 222 to Time 225 is repeated. The number of the light exposure operations is not limited to one, and the light exposure operation may be performed repeatedly. In the case where the light exposure operation is repeated, the node 121 retains the lowest potential of potentials obtained by the repeated light exposure operations. That is, the node 121 retains a potential at the time when the amount of incident light is the largest.

An output operation is described. At Time 228, when the selection signal line (SE) is set to a high level, a voltage corresponding to the potential retained in the node 121 is output from OUT. At Time 229, when the selection signal line (SE) is set to a low level, the output from OUT is stopped.

In this operation, the light exposure operation includes reset of the node 111. Even when the light exposure operation is performed plural times, the first light exposure operation and the second to last light exposure operations are performed in the same manner. This leads to an advantage that the configuration of the driver circuit can be simplified.

As described above, in the imaging element of one embodiment of the present invention, the charge retention portion of each pixel can retain only a potential at the time when the amount of light incident on the photodiode is the largest. In other words, the charge retention portion of each pixel can retain a potential obtained by light exposure operations performed at different times. Then, the potential retained in the charge retention portion is output as a voltage signal and converted into image data. The obtained image data corresponds to image data that is obtained by superimposition of images taken by light exposure operations at different times. Therefore, even in shooting modes such as long exposure and multiple exposure, image data does not need to be stored in a memory medium or the like in each light exposure operation.

Furthermore, a voltage signal is not output from the pixel in the light exposure operation; therefore, the A/D conversion circuit or the like to which a voltage signal is input does not need to be driven. Therefore, power supply to the A/D conversion circuit or the like can be stopped in the light exposure operation; thus, generation of dark current noise can be prevented and power consumption can be reduced in an imaging device including the imaging element of one embodiment of the present invention.

This embodiment can be combined with any other embodiment as appropriate. Thus, content (or may be part of the content) described in this embodiment may be applied to, combined with, or replaced by different content (or may be part of the different content) described in the embodiment and/or content (or may be part of the content) described in one or more different embodiments. Note that in each embodiment, a content described in the embodiment is a content described with reference to a variety of diagrams or a content described with a text described in this specification. In addition, by combining a diagram (or part thereof) described in one embodiment with another part of the diagram, a different diagram (or part thereof) described in the same embodiment, and/or a diagram (or part thereof) described in another or other embodiments, much more diagrams can be formed. The same can be applied to any other embodiment.

(Embodiment 2)

In this embodiment, structures of transistors and the like which can be used for the imaging element of one embodiment of the present invention are described.

Figure 9:
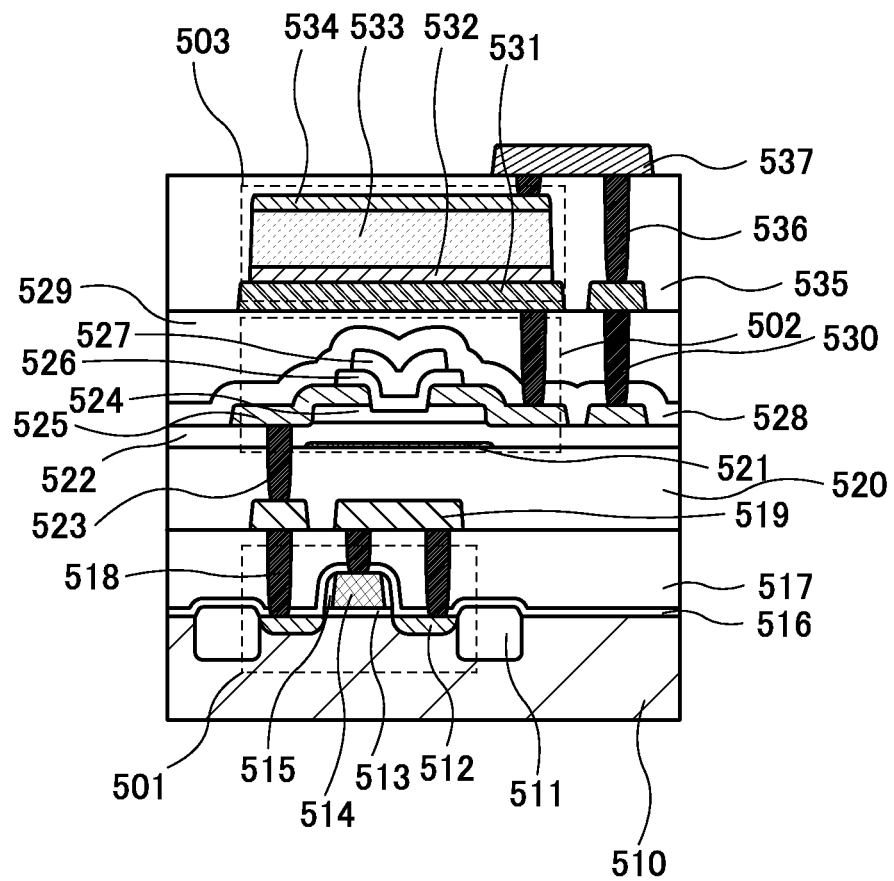
FIG. 9 is a cross-sectional view illustrating an example of an imaging element.

An imaging device illustrated in FIG. 9 includes a transistor 501, a transistor 502 over the transistor 501, and a photodiode 503 over the transistor 502. The transistor 501 is electrically connected to the transistor 502 through a wiring 519 and a conductor 523, and the transistor 502 is electrically connected to the photodiode 503 through a conductor 530. Note that in FIG. 9, the transistor 501 functions as a diode, and the transistor 502 functions as a transfer transistor. Note that the transistor 501 and the transistor 502 are not necessarily used as a diode and a transfer transistor, and may be used as transistors included in an amplifier circuit, a driver circuit, a processing circuit, or the like.

The transistor 501 is described. The transistor 501 is formed using a semiconductor substrate 510 and includes an element separation layer 511 over the semiconductor substrate 510 and impurity regions 512 formed in the semiconductor substrate 510. The impurity regions 512 function as a source region and a drain region, and a channel region is formed between the impurity regions 512. The transistor 501 further includes an insulating layer 513 and a conductive layer 514. The insulating layer 513 functions as a gate insulating layer, and the conductive layer 514 functions as a gate electrode. Note that a side wall 515 may be formed on the side surface of the conductive layer 514. Furthermore, an insulating layer 516 functioning as a protective film, and an insulating layer 517 functioning as a planarization film can be formed over the conductive layer 514.

A silicon substrate is used as the semiconductor substrate 510. Note that germanium, silicon germanium, silicon carbide, gallium arsenide, aluminum gallium arsenide, indium phosphide, gallium nitride, or an organic semiconductor as well as silicon can be used as a material of the substrate.

The element separation layer 511 can be formed by a local oxidation of silicon (LOCOS) method, a shallow trench isolation (STI) method, or the like.

The impurity regions 512 include an impurity element imparting conductivity to the material of the semiconductor substrate 510. When a silicon substrate is used as the semiconductor substrate 510, phosphorus, arsenic, or the like is used as the impurity imparting n-type conductivity; and boron, aluminum, gallium, or the like is used as the impurity imparting p-type conductivity. The impurity element can be added to a predetermined region of the semiconductor substrate 510 by an ion implantation method, an ion doping method, or the like.

The insulating layer 513 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 513 may be a stack of any of the above materials.

The conductive layer 514 can be formed using a conductive film of aluminum, titanium, chromium, cobalt, nickel, copper, yttrium, zirconium, molybdenum, silver, manganese, tantalum, tungsten, or the like. It is also possible to use an alloy or a conductive nitride of any of these materials. It is also possible to use a stack of a plurality of materials selected from these materials, alloys of these materials, and conductive nitrides of these materials.

The insulating layer 516 can be formed using an insulating film containing at least one of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 516 may be a stack of any of the above materials.

An organic material such as an acrylic resin, an epoxy resin, a benzocyclobutene resin, polyimide, or polyamide can be used for the insulating layer 517. The insulating layer 517 may be a stack pf any of the above materials.

In order that the transistor 501 functions as a diode, the gate electrode is electrically connected to one of the source region and the drain region. As illustrated in FIG. 9, the conductive layer 514 may be connected to the impurity regions 512 with a conductor 518 and the wiring 519.

Next, the transistor 502 is described. The transistor 502 includes an insulating layer 522, an oxide semiconductor layer 524 over the insulating layer 522, conductive layers 525 over the oxide semiconductor layer 524, an insulating layer 526 over the conductive layers 525, and a conductive layer 527 over the insulating layer 526. The conductive layers 525 function as a source electrode and a drain electrode. The insulating layer 526 functions as a gate insulating layer, and the conductive layer 527 functions as a gate electrode. Furthermore, an insulating layer 528 functioning as a protective film and an insulating layer 529 functioning as a planarization film can be formed over the conductive layer 527. Note that a conductive layer 521 functioning as a back gate electrode may be provided below the insulating layer 522. In the case where the conductive layer 521 is formed, an insulating layer 520 can be formed over the wiring 519, and the conductive layer 521 can be formed over the insulating layer 520. Alternatively, part of the wiring 519 may serve as a back gate electrode.

The insulating layer 522 can be formed using an insulating film containing at least one of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 522 may be a stack of any of the above materials. Note that it is preferable that the insulating layer 522 have a function of supplying oxygen to the oxide semiconductor layer 524. This is because even in the case where oxygen vacancies are present in the oxide semiconductor layer 524, the oxygen vacancies are repaired by oxygen supplied from the insulating layer 522. An example of treatment for supplying oxygen is heat treatment.

The oxide semiconductor layer 524 can be formed using an oxide semiconductor film. As the oxide semiconductor, for example, any of the following can be used: indium oxide, tin oxide, gallium oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide, In—Sn—Hf—Zn oxide, and In—Hf—Al—Zn oxide. In particular, In—Ga—Zn oxide is preferable.

Here, In—Ga—Zn oxide means oxide containing In, Ga, and Zn as its main components. Note that a metal element other than In, Ga, and Zn may be contained as an impurity. Note that a film formed using In—Ga—Zn oxide is also referred to as an IGZO film.

The conductive layers 525 can be formed using a conductive film of aluminum, titanium, chromium, cobalt, nickel, copper, yttrium, zirconium, molybdenum, silver, manganese, tantalum, tungsten, or the like. It is also possible to use an alloy or a conductive nitride of any of these materials. It is also possible to use a stack of a plurality of materials selected from these materials, alloys of these materials, and conductive nitrides of these materials. Typically, it is preferable to use titanium, which is particularly easily bonded to oxygen, or tungsten, which has a high melting point and thus allows subsequent process temperatures to be relatively high. It is also possible to use a stack of any of the above materials and copper or an alloy such as copper-manganese, which has low resistance. When a material which is easily bonded to oxygen is used for the conductive layer 525, and the conductive layer 525 and the oxide semiconductor layer 524 are in contact with each other, a region including oxygen vacancies is formed in the oxide semiconductor layer 524. Hydrogen slightly contained in the oxide semiconductor layer 524 is diffused into the oxygen vacancies, whereby the region is markedly changed to an n-type region. The n-type region can function as a source region or a drain region of the transistor.

The insulating layer 526 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 526 may be a stack of any of the above materials.

The conductive layer 527 can be formed using a conductive film of aluminum, titanium, chromium, cobalt, nickel, copper, yttrium, zirconium, molybdenum, silver, manganese, tantalum, tungsten, or the like. It is also possible to use an alloy or a conductive nitride of any of these materials. It is also possible to use a stack of a plurality of materials selected from these materials, alloys of these materials, and conductive nitrides of these materials.

The insulating layer 528 can be formed using an insulating film containing at least one of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 528 may be a stack of any of the above materials.

An organic material such as an acrylic resin, an epoxy resin, a benzocyclobutene resin, polyimide, or polyamide can be used for the insulating layer 529. The insulating layer 529 may be a stack of any of the above materials.

Next, the photodiode 503 is described. In the photodiode 503, an n-type semiconductor layer 532, an i-type semiconductor layer 533, and a p-type semiconductor layer 534 are stacked in this order. The i-type semiconductor layer 533 is preferably formed using amorphous silicon. Furthermore, the n-type semiconductor layer 532 and the p-type semiconductor layer 534 can be formed using amorphous silicon or microcrystalline silicon including an impurity imparting conductivity. A photodiode using amorphous silicon is preferable because its sensitivity in a wavelength region of visible light is high. Note that the p-type semiconductor layer 534 serves as a light-receiving surface, whereby the output current of the photodiode can be increased.

In the photodiode 503, the n-type semiconductor layer 532 functioning as a cathode is electrically connected to the conductive layer 525 of the transistor 502 through the conductor 530. Furthermore, the p-type semiconductor layer 534 functioning as an anode is electrically connected to a wiring 537. Note that the p-type semiconductor layer 534 can be connected to another wiring though a wiring 531 or a conductor 536. An insulating layer 535 functioning as a protective film can be formed.

In the element structure in FIG. 9, it is possible to form the transistor 501 and the transistor 502 to overlap each other, so that a pixel with a high aperture ratio can be formed. Furthermore, since the photodiode 503 is formed over the transistors and the wirings, the pixel can have a higher aperture ratio.

Figure 10A:
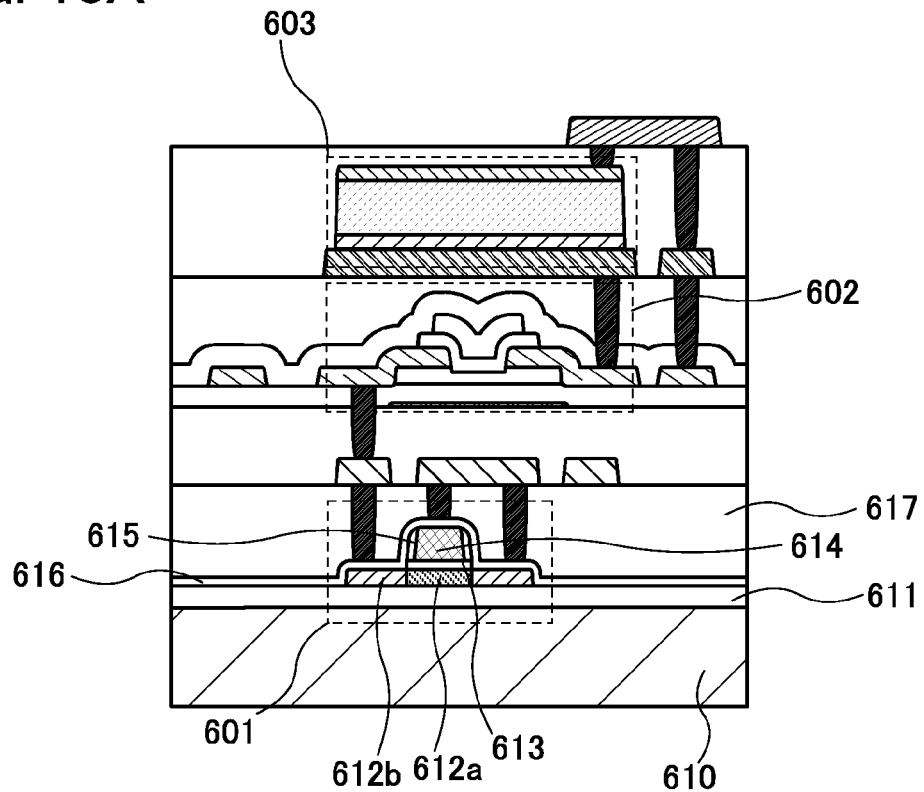
FIGS. 10A and 10B are cross-sectional views each illustrating an example of an imaging element.

FIG. 10A illustrates an example of an imaging element having another element structure. The imaging element in FIG. 10A includes a transistor 601, a transistor 602 over the transistor 601, and a photodiode 603 over the transistor 602. Since the transistor 602 and the photodiode 603 have the same structures as the transistor 502 and the photodiode 503 in FIG. 9, respectively, descriptions thereof are omitted here.

The transistor 601 is described. The transistor 601 includes a substrate 610, an insulating layer 611 over the substrate 610, a semiconductor layer 612 over the insulating layer 611, an insulating layer 613 over the semiconductor layer 612, and a conductive layer 614 over the insulating layer 613. The semiconductor layer 612 includes a channel formation region 612a and impurity regions 612b. The insulating layer 613 functions as a gate insulating layer, and the conductive layer 614 functions as a gate electrode. Note that a side wall 615 may be formed on the side surface of the conductive layer 614. Furthermore, an insulating layer 616 functioning as a protective film, and an insulating layer 617 functioning as a planarization film can be formed over the conductive layer 614.

Examples of the substrate 610 include semiconductor substrates (e.g., a single crystal substrate and a silicon substrate), an SOI substrate, a glass substrate, a quartz substrate, a plastic substrate, a metal substrate, a stainless steel substrate, a substrate containing stainless steel foil, a tungsten substrate, a substrate containing tungsten foil, a flexible substrate, an attachment film, paper containing a fibrous material, and a base material film. As an example of a glass substrate, a barium borosilicate glass substrate, an aluminoborosilicate glass substrate, soda lime glass substrate, and the like can be given. For a flexible substrate, a flexible synthetic resin such as plastics typified by polyethylene terephthalate (PET), polyethylene naphthalate (PEN), and polyether sulfone (PES), or acrylic can be used, for example. For an attachment film, polypropylene, polyester, polyvinyl fluoride, polyvinyl chloride, or the like can be used, for example. For a base material film, polyester, polyamide, polyimide, an inorganic vapor deposition film, paper, or the like can be used, for example.

The insulating layer 611 can be formed using an insulating film containing at least one of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 528 may be a stack of any of the above materials.

The semiconductor layer 612 is a film containing an oxide semiconductor material. As the semiconductor material, silicon, germanium, silicon germanium, silicon carbide, gallium arsenide, aluminum gallium arsenide, indium phosphide, gallium nitride, an organic semiconductor, or the like can be used. The semiconductor layer 612 includes the channel formation region 612a and the impurity regions 612b. The impurity regions 612b are regions including an impurity element imparting conductivity to the semiconductor material. When silicon is used as the semiconductor material, for example, phosphorus, arsenic, or the like is used as the impurity imparting n-type conductivity, and boron, aluminum, gallium, or the like is used as the impurity imparting p-type conductivity. The impurity element can be added to a predetermined region of the semiconductor layer 612 by an ion implantation method, an ion doping method, or the like.

The insulating layer 613 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 613 may be a stack of any of the above materials.

The conductive layer 614 can be formed using a conductive film of aluminum, titanium, chromium, cobalt, nickel, copper, yttrium, zirconium, molybdenum, silver, manganese, tantalum, tungsten, or the like. It is also possible to use an alloy or a conductive nitride of any of these materials. It is also possible to use a stack of a plurality of materials selected from these materials, alloys of these materials, and conductive nitrides of these materials.

The insulating layer 616 can be formed using an insulating film containing at least one of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 616 may be a stack of any of the above materials.

An organic material such as an acrylic resin, an epoxy resin, a benzocyclobutene resin, polyimide, or polyamide can be used for the insulating layer 617. The insulating layer 617 may be a stack of any of the above materials.

In the element structure in FIG. 10A, it is possible to form the transistor 601 and the transistor 602 to overlap each other, so that a pixel with a high aperture ratio can be formed. Furthermore, since the photodiode 603 is formed over the transistors and the wirings, the pixel can have a higher aperture ratio.

Figure 10B:
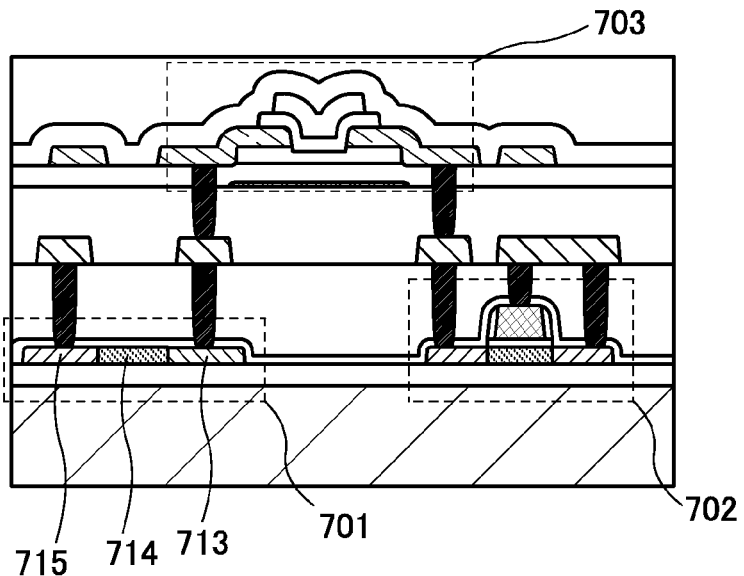

FIG. 10B illustrates an example of an imaging element having another element structure. The imaging element in FIG. 10B includes a photodiode 701, a transistor 702, and a transistor 703 over the photodiode 701 and the transistor 702. Since the transistor 702 and the transistor 703 have the same structures as the transistor 601 in FIG. 10A and the transistor 502 in FIG. 9, respectively, descriptions thereof are omitted here.

The photodiode 701 is described. The photodiode 701 includes an n-type semiconductor region 713, an i-type semiconductor region 714, and a p-type semiconductor region 715. As a material of the photodiode 701, silicon, germanium, silicon germanium, silicon carbide, gallium arsenide, aluminum gallium arsenide, indium phosphide, gallium nitride, an organic semiconductor, or the like can be used.

In the element structure in FIG. 10B, since common steps can be used for manufacturing the photodiode 701 and the transistor 702, the number of manufacturing steps can be reduced, which can reduce the manufacturing cost.

Figure 11:
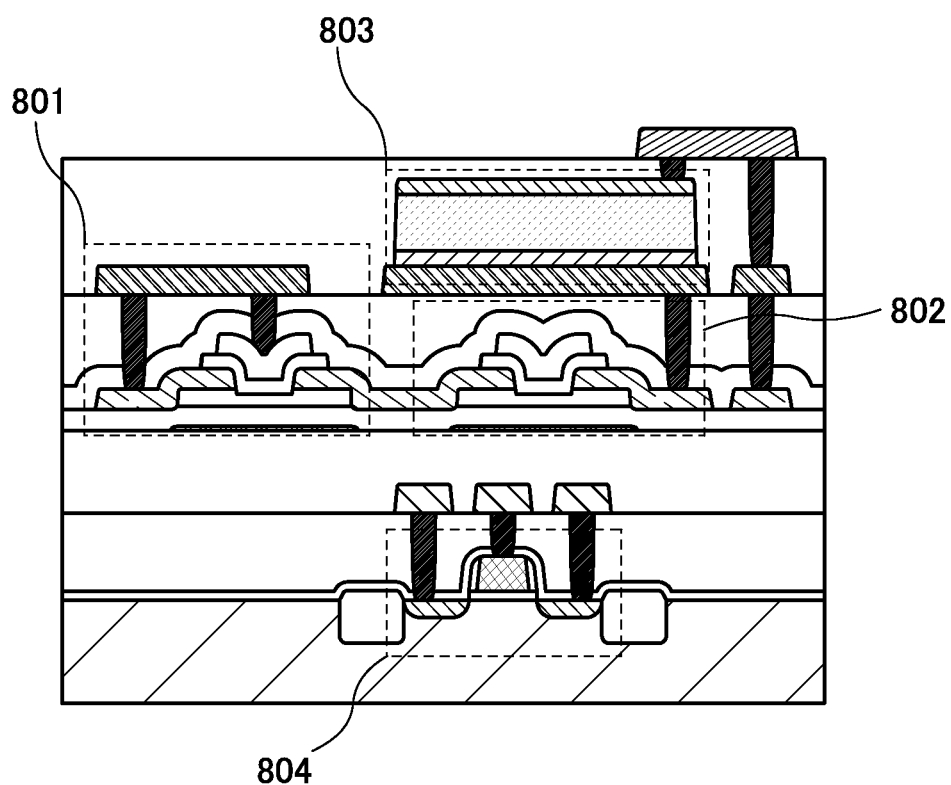
FIG. 11 is a cross-sectional view illustrating an example of an imaging element.

FIG. 11 illustrates an example of an imaging element having another element structure. The imaging element in FIG. 11 includes a transistor 804, transistors 801 and 802 over the transistor 804, and a photodiode 803. Since the transistors 801 and 802 have the same structures as the transistor 502 in FIG. 9, the photodiode 803 has the same structure as the photodiode 503 in FIG. 9, and the transistor 804 has the same structure as the transistor 501 in FIG. 9, descriptions thereof are omitted here.

In FIG. 11, the transistor 801 functions as a diode, and the transistor 802 functions as a transfer transistor. Since the transistor 801 and the transistor 802 are each a transistor including an oxide semiconductor layer, leakage current can be reduced. Note that the transistor 804 can be used as a transistor included in an amplifier circuit, a driver circuit, a processing circuit, or the like.

Figure 12:
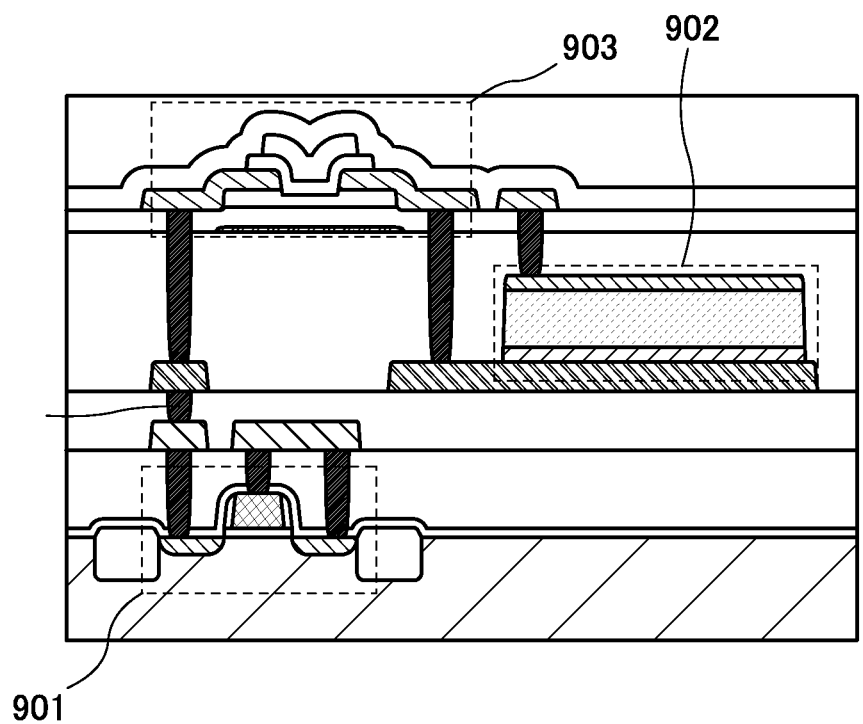
FIG. 12 is a cross-sectional view illustrating an example of an imaging element.

FIG. 12 illustrates an example of an imaging element having another element structure. The imaging element in FIG. 12 includes a transistor 901, a photodiode 902 over the transistor 901, and a transistor 903. Since the transistor 901 has the same structures as the transistor 501 in FIG. 9, the photodiode 902 has the same structure as the photodiode 503 in FIG. 9, and the transistor 903 has the same structure as the transistor 502 in FIG. 9, descriptions thereof are omitted here.

In FIG. 12, the transistor 901 functions as a diode, and the transistor 903 functions as a transfer transistor. Since the transistor 903 is a transistor including an oxide semiconductor layer, leakage current can be reduced.

This embodiment can be implemented in appropriate combination with any of the structures described in the other embodiments.

(Embodiment 3)

A transistor including an oxide semiconductor layer can be used in the imaging element of one embodiment of the present invention. As the transistor including an oxide semiconductor layer, any of transistors having a variety of element structures can be used. Element structures of transistors including oxide semiconductor layers are described with reference to FIGS. 13A to 13C.

Figure 13A:
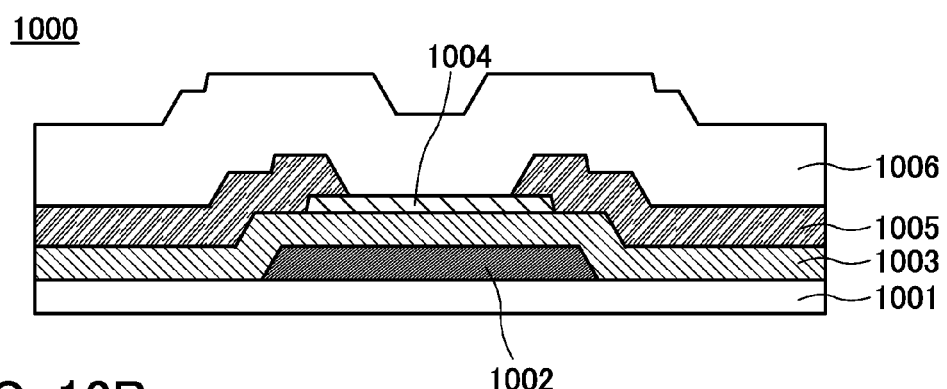
FIGS. 13A to 13C are cross-sectional views each illustrating an example of a transistor.

A transistor 1000 illustrated in FIG. 13A includes an insulating layer 1001, a conductive layer 1002 over the insulating layer 1001, an insulating layer 1003 over the conductive layer 1002, an oxide semiconductor layer 1004 over the insulating layer 1003, conductive layers 1005, and an insulating layer 1006 over the conductive layers 1005. The transistor 1000 has what is called an inverted staggered structure. The conductive layer 1002 functions as a gate electrode, the insulating layer 1003 functions as a gate insulating layer, and the conductive layers 1005 function as a source electrode and a drain electrode. Although not illustrated, in the case where an element such as a photodiode is provided over the transistor 1000, an insulating film functioning as a planarization film can be formed over the insulating layer 1006. Furthermore, although not illustrated, a back gate electrode can be formed over the insulating layer 1006. The back gate electrode can increase the on-state current of the transistor, and makes it possible to control the threshold voltage, for example.

In the case of the transistor 1000, it is preferable that the insulating layer 1006 be capable of supplying oxygen to the oxide semiconductor layer 1004. At a step for forming the insulating layer 1006 or a subsequent heat treatment step, oxygen can be supplied from the insulating layer 1006 to the oxide semiconductor layer 1004; therefore, oxygen vacancies formed in the oxide semiconductor layer 1004 can be compensated by the supplied oxygen. As a result, a transistor with stable electrical characteristics can be obtained.

Figure 13B:
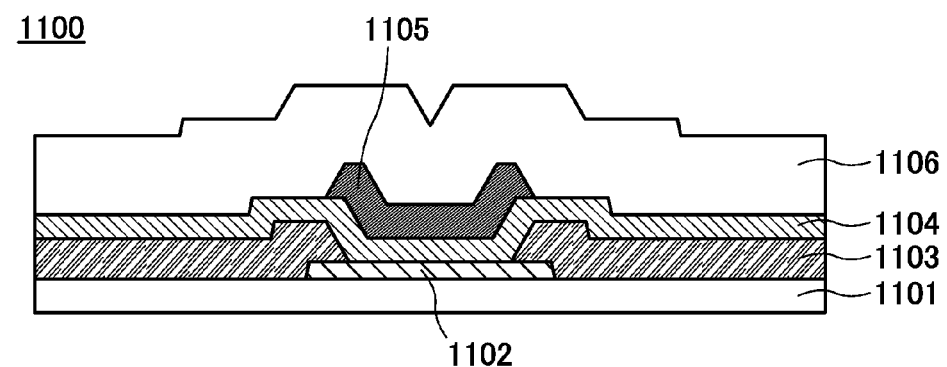

A transistor 1100 illustrated in FIG. 13B includes an insulating layer 1101, an oxide semiconductor layer 1102 over the insulating layer 1101, conductive layers 1103 over the oxide semiconductor layer 1102, an insulating layer 1104 over the conductive layers 1103, a conductive layer 1105 over the insulating layer 1104, and an insulating layer 1106 over the conductive layer 1105. The conductive layers 1103 function as a source electrode and a drain electrode, the insulating layer 1104 functions as a gate insulating layer, and the conductive layer 1105 functions as a gate electrode. Although not illustrated, in the case where an element such as a photodiode is provided over the transistor 1100, an insulating film functioning as a planarization film can be formed over the insulating layer 1106. Furthermore, although not illustrated, a back gate electrode can be formed below the insulating layer 1101.

In the case of the transistor 1100, it is preferable that the insulating layer 1101 be capable of supplying oxygen to the oxide semiconductor layer 1102. At a heat treatment step after formation of the oxide semiconductor layer, oxygen can be supplied from the insulating layer 1101 to the oxide semiconductor layer 1102; therefore, oxygen vacancies formed in the oxide semiconductor layer 1102 can be compensated by the supplied oxygen. As a result, a transistor with stable electrical characteristics can be obtained.

Figure 13C:
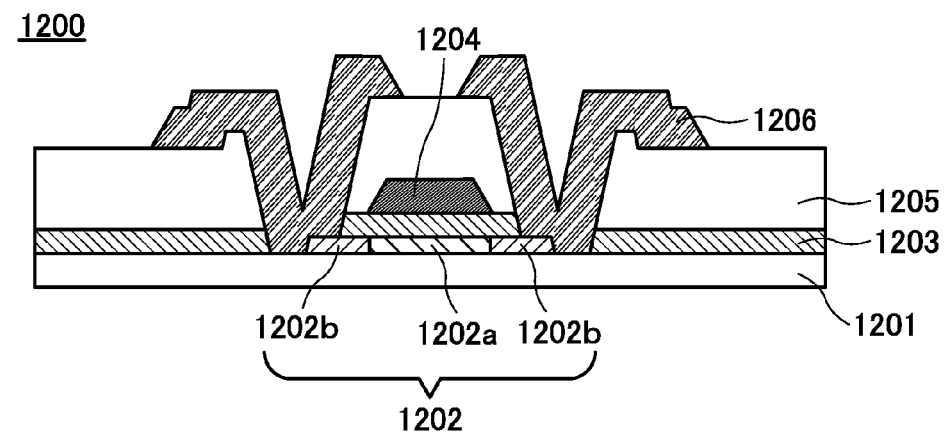

A transistor 1200 illustrated in FIG. 13C includes an insulating layer 1201, an oxide semiconductor layer 1202 over the insulating layer 1201, an insulating layer 1203 over the oxide semiconductor layer 1202, a conductive layer 1204 over the insulating layer 1203, an insulating layer 1205 over the conductive layer 1204, and conductive layers 1206 over the insulating layer 1205. The oxide semiconductor layer 1202 includes a channel formation region 1202a and impurity regions 1202b. The impurity regions 1202b function as a source region and a drain region and are electrically connected to the conductive layers 1206 functioning as a source electrode and a drain electrode. The insulating layer 1203 functions as a gate insulating layer, and the conductive layer 1204 functions as a gate electrode. Although not illustrated, in the case where an element such as a photodiode is provided over the transistor 1200, an insulating film functioning as a planarization film can be formed over the conductive layers 1206. Furthermore, although not illustrated, a back gate electrode can be formed below the insulating layer 1201.

In the case of the transistor 1200, it is preferable that the insulating layer 1201 be capable of supplying oxygen to the oxide semiconductor layer 1202. At a heat treatment step after formation of the oxide semiconductor layer, oxygen can be supplied from the insulating layer 1201 to the oxide semiconductor layer 1202; therefore, oxygen vacancies formed in the oxide semiconductor layer 1202 can be compensated by the supplied oxygen. As a result, a transistor with stable electrical characteristics can be obtained.

Oxygen vacancies may be formed in the impurity regions 1202b by addition of an impurity element. As an impurity for forming oxygen vacancies in the oxide semiconductor layer 1202, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity element, plasma treatment, an ion implantation method, an ion doping method, a plasma immersion ion implantation method, or the like can be used. When the impurity element is added to the oxide semiconductor layer, a bond between a metal element and oxygen in the oxide semiconductor layer is cut, whereby an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

The transistor including an oxide semiconductor layer has a lower off-state current than a transistor including a silicon semiconductor layer. When a voltage between the source and the drain is 0.1 V, 5 V, or 10 V, the off-state current of the transistor including an oxide semiconductor layer, which is standardized on the channel width of the transistor, is several yoctoamperes per micrometer to several zeptoamperes per micrometer. Therefore, when the transistor including an oxide semiconductor layer is electrically connected to a node retaining charge, a reduction in the potential of the node can be inhibited for a long period.

This embodiment can be implemented in appropriate combination with any of the structures described in the other embodiments.

(Embodiment 4)

In this embodiment, an oxide semiconductor included in a transistor including an oxide semiconductor layer that is provided in an imaging device is described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this embodiment, one embodiment which can be applied to an oxide semiconductor film in the transistor included in the imaging device described in the above embodiment is described.

It is preferable that the oxide semiconductor film include a CAAC-OS film. The CAAC-OS film includes crystals whose c-axes are aligned; however, no grain boundary between the crystals is clearly observed. The crystals whose c-axes are aligned are less likely to be etched, so that in a channel-etched transistor, a small amount of an oxide semiconductor film is overetched when a pair of electrodes is formed. For this reason, with the use of a CAAC-OS film for the oxide semiconductor film, a channel-etched transistor can be manufactured. Note that a channel-etched transistor can have a structure in which the distance between a pair of electrodes, that is, a channel length, is as short as greater than or equal to 0.5 μm and less than or equal to 6.5 μm, preferably greater than 1 μm and less than 6 μm.

The oxide semiconductor film may include one or more of an oxide semiconductor having a single-crystal structure (hereinafter referred to as a single-crystal oxide semiconductor), an oxide semiconductor having a polycrystalline structure (hereinafter referred to as a polycrystalline oxide semiconductor), and an oxide semiconductor having a microcrystalline structure (hereinafter referred to as a microcrystalline oxide semiconductor). Described below are the CAAC-OS, the single-crystal oxide semiconductor, the polycrystalline oxide semiconductor, and the microcrystalline oxide semiconductor.

<CAAC-OS>

The CAAC-OS film is one of oxide semiconductor films having a plurality of crystal parts. The crystal parts included in the CAAC-OS film each have c-axis alignment. In a plan TEM image, the area of the crystal parts included in the CAAC oxide film is greater than or equal to 2500 nm$^2$, preferably greater than or equal to 5 μm$^2$, further preferably greater than or equal to 1000 μm$^2$. Furthermore, in a cross-sectional TEM image, when the proportion of the crystal parts is greater than or equal to 50%, preferably greater than or equal to 80%, further preferably greater than or equal to 95% of the CAAC-OS film, the CAAC-OS film is a thin film having physical properties similar to those of a single crystal.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (luminescent spots) having alignment are shown.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film is analyzed by an out-of-plane method, a peak appears frequently when the diffraction angle (2θ) is around 31°. This peak is derived from the (00x) plane (x is an integral number) of an In—Ga—Zn oxide crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the In—Ga—Zn oxide crystal. Here, analysis (φ scan) is performed under conditions where the sample is rotated around a normal vector of a sample surface as an axis (φ axis) with 2θ fixed at around 56°. In the case where the sample is a single-crystal metal oxide semiconductor film of In—Ga—Zn oxide, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film is analyzed by an out-of-plane method, a peak of 2θ may also be observed at around 36°, in addition to the peak of 2θ at around 31°. The peak of 2θ at around 36° indicates that a crystal part having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

<Single Crystal Oxide Semiconductor>

The single-crystal oxide semiconductor film has a lower impurity concentration and a lower density of defect states (small amount of oxygen vacancy). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

<Polycrystalline Oxide Semiconductor>

In an image obtained with a TEM, for example, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. When a polycrystalline oxide semiconductor film is analyzed by an out-of-plane method with use of an XRD apparatus, a single peak or a plurality of peaks appear in some cases. For example, in the case of a polycrystalline IGZO film, a peak at 2θ of around 31° which shows alignment or plural peaks which show plural kinds of alignment appear in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor using the polycrystalline oxide semiconductor film has larger variation in electrical characteristics and lower reliability than a transistor using a CAAC-OS film in some cases.

<Microcrystalline Oxide Semiconductor>

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film obtained by using an electron beam having a probe diameter (e.g., larger than or equal to 50 nm) larger than a diameter of a crystal part. Meanwhile, spots are observed in an electron diffraction pattern of the nc-OS film obtained by using an electron beam having a diameter (e.g., larger than or equal to 1 nm and smaller than or equal to 30 nm) close to or smaller than the size of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Note that the structures, methods, and the like described in this embodiment can be used as appropriate in combination with any of the structures, methods, and the like described in the other embodiments.

(Embodiment 5)

Figure 14A:
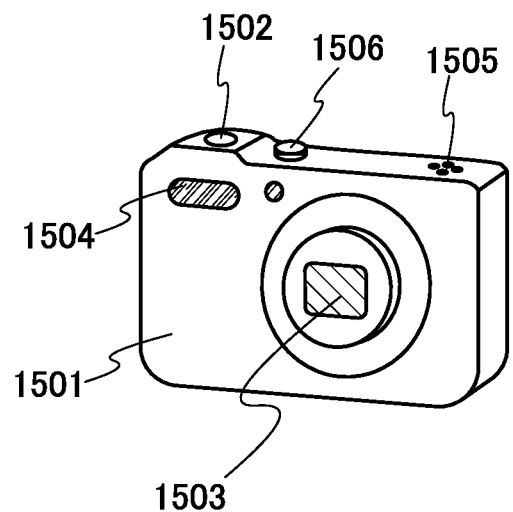
FIGS. 14A and 14B illustrate a specific example of an imaging device.
Figure 14B:
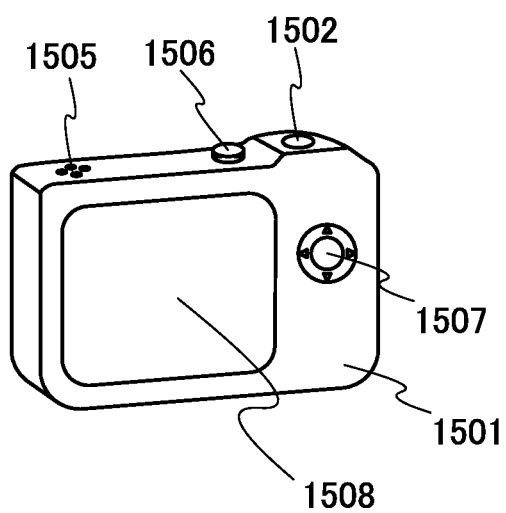

An imaging device of one embodiment of the present invention is described. An electronic appliance illustrated in FIGS. 14A and 14B is a digital camera. The digital camera includes a housing 1501, a shutter button 1502, a lens 1503, a flash light 1504, a microphone 1505, an operation button 1506, a selection button 1507, and a display screen 1508. The housing 1501 includes the imaging device of one embodiment of the present invention in a position corresponding to a focus of the lens 1503. The shooting mode of the digital camera can be switched with the operation button 1506. That is, a user can select not only a normal shooting mode but also a shooting mode such as a long exposure mode or a multiple exposure mode with the operation button 1506. Note that shooting modes may be displayed on the display screen 1508 so that a user can select a shooting mode from the displayed shooting modes using the selection button 1507. Alternatively, a touch sensor may be provided in the display screen 1508 so that a user can select a shooting mode by touching the display screen 1508 displaying shooting modes. A liquid crystal element, an OLED element, or the like can be used as the element used in the display screen 1508. A resistive touch sensor, a capacitive touch sensor, an optical touch sensor, or the like can be used for the touch panel.

Figure 15:
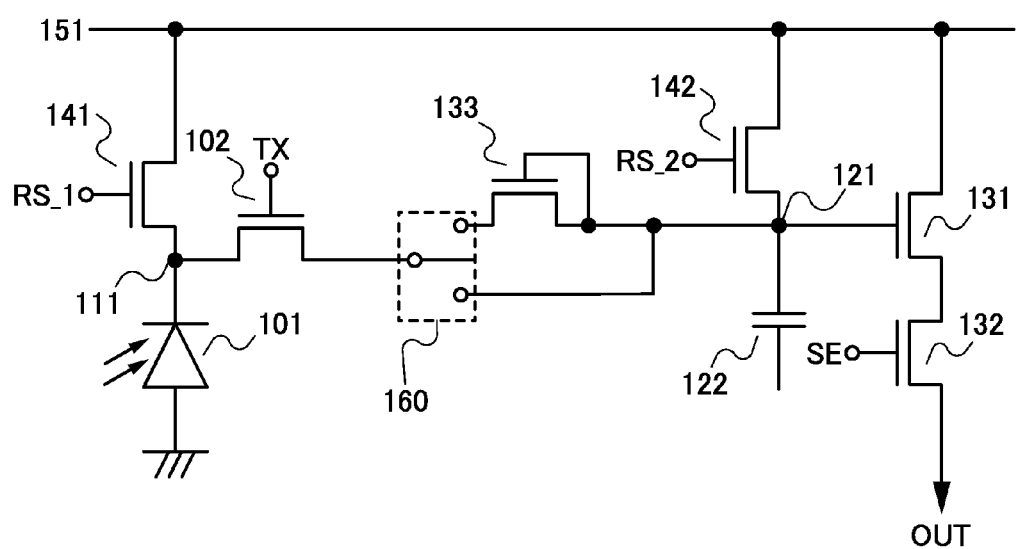
FIG. 15 is a circuit diagram illustrating an example of a configuration of an imaging device.

FIG. 15 illustrates an example of a circuit diagram capable of switching the shooting mode. The circuit diagram of FIG. 15 is the circuit diagram of FIG. 4 in which a switch 160 is provided between the transfer transistor 102 and the transistor 133. That is, a switch for switching the shooting mode is provided in each pixel. The switches in the pixels may be connected to a common signal line so that switching is performed at a time. Note that the switch may be formed using a transistor. The transistor 133 is turned on or off depending on selection of the shooting mode. For example, in the case of a shooting mode such as long exposure or multiple exposure, the transfer transistor 102 and the transistor 133 are connected through the switch 160 so as to be brought into conduction. In the case of a normal shooting mode, the transfer transistor 102 is connected to the node 121 through the switch 160 without the transistor 133 positioned therebetween.

In the imaging device of one embodiment of the present invention, even in the case of a shooting mode such as long exposure or multiple exposure, a plurality of pieces of image data for synthesis do not need to be stored in the memory medium. Furthermore, synthesis of pieces of image data using special image processing software is not necessary. Thus, the imaging device of one embodiment of the present invention allows a user to readily use a shooting mode such as long exposure or multiple exposure without any concern for the capacity of the memory medium.

This application is based on Japanese Patent Application serial no. 2014-111133 filed with Japan Patent Office on May 29, 2014, the entire contents of which are hereby incorporated by reference.

What is claimed is:

1. An imaging element comprising a pixel, the pixel comprising:
   a photodiode;
   a first transistor including an oxide semiconductor layer;
   a second transistor;
   a third transistor;
   a diode; and
   a charge retention portion,
   wherein one of a source and a drain of the first transistor is electrically connected to a first electrode of the photodiode and to one of a source and a drain of the second transistor through a first node, wherein the other of the source and the drain of the first transistor is electrically connected to a first electrode of the diode, wherein a second electrode of the diode is electrically connected to the charge retention portion and to one of a source and a drain of the third transistor, wherein the other of the source and the drain of the second transistor is electrically connected to the other of the source and the drain of the third transistor, wherein a gate of the second transistor is connected to a first reset signal line, wherein a gate of the third transistor is connected to a second reset signal line, wherein a polarity of the first electrode of the photodiode is the same as a polarity of the first electrode of the diode, wherein charge generated by the photodiode is configured to be accumulated in the first node, and wherein a potential of the charge retention portion is configured to be changed in the case where a potential of the first node is lower than the potential of the charge retention portion.

2. The imaging element according to claim 1, wherein the oxide semiconductor layer includes an In—Ga—Zn oxide.

3. The imaging element according to claim 1, wherein the photodiode is over the oxide semiconductor layer.

4. An electronic appliance comprising the imaging element according to claim 1, wherein the electronic appliance comprises a display device, a shutter button, a lens, a flash light, a microphone, or an operation button.

5. An imaging element comprising a pixel, the pixel comprising:
 a photodiode;
 a first transistor including an oxide semiconductor layer;
 a second transistor including the oxide semiconductor layer;
 a third transistor including the oxide semiconductor layer;
 a diode; and
 a charge retention portion, wherein one of a source and a drain of the first transistor is electrically connected to a first electrode of the photodiode and to one of a source and a drain of the second transistor through a first node, wherein the other of the source and the drain of the first transistor is electrically connected to a first electrode of the diode, wherein a second electrode of the diode is electrically connected to the charge retention portion and to one of a source and a drain of the third transistor, wherein the other of the source and the drain of the second transistor is electrically connected to the other of the source and the drain of the third transistor, wherein a gate of the second transistor is connected to a first reset signal line, wherein a gate of the third transistor is connected to a second reset signal line, wherein a polarity of the first electrode of the photodiode is the same as a polarity of the first electrode of the diode, wherein charge generated by the photodiode is configured to be accumulated in the first node, and wherein a potential of the charge retention portion is configured to be changed in the case where a potential of the first node is lower than the potential of the charge retention portion.

6. The imaging element according to claim 5, wherein the oxide semiconductor layer includes an In—Ga—Zn oxide.

7. The imaging element according to claim 5, wherein the photodiode is over the oxide semiconductor layer.

8. An electronic appliance comprising the imaging element according to claim 5, wherein the electronic appliance comprises a display device, a shutter button, a lens, a flash light, a microphone, or an operation button.

* * * * *